(12) United States Patent
Iyer

(10) Patent No.: US 7,101,815 B2
(45) Date of Patent: *Sep. 5, 2006

(54) METHOD FOR IMPROVING THICKNESS UNIFORMITY OF DEPOSITED OZONE-TEOS SILICATE GLASS LAYERS

(75) Inventor: Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/928,505

(22) Filed: Aug. 26, 2004

(65) Prior Publication Data

US 2005/0032394 A1    Feb. 10, 2005

Related U.S. Application Data

(63) Continuation of application No. 10/371,674, filed on Feb. 21, 2003, now Pat. No. 6,784,122, which is a continuation of application No. 08/841,908, filed on Apr. 17, 1997, now Pat. No. 6,551,665.

(51) Int. Cl.
    *C23C 16/40* (2006.01)

(52) U.S. Cl. .................. 438/787; 438/788; 438/789; 438/790; 427/535; 427/579; 427/255.37

(58) Field of Classification Search ............... 427/535, 427/539, 579, 255.37; 438/287, 788, 789, 438/790
    See application file for complete search history.

(56) References Cited

U.S. PATENT DOCUMENTS

| | | | |
|---|---|---|---|
| 4,872,947 A | 10/1989 | Wang et al. | |
| 4,992,306 A | 2/1991 | Hochberg et al. | |
| 5,271,972 A | 12/1993 | Kwok et al. | |
| 5,356,722 A | 10/1994 | Nguyen et al. | |
| 5,362,526 A | 11/1994 | Wang et al. | |
| 5,503,882 A | 4/1996 | Dawson | |
| 5,593,741 A | 1/1997 | Ikeda | |
| 5,626,924 A | 5/1997 | Ishikawa | |
| 5,776,254 A | 7/1998 | Yuuki et al. | |
| 5,827,785 A | 10/1998 | Bhan et al. | |
| 6,107,214 A * | 8/2000 | Iyer | 438/787 |
| 6,251,807 B1 | 6/2001 | Iyer | |
| 6,297,175 B1 * | 10/2001 | Iyer | 438/787 |
| 6,458,721 B1 * | 10/2002 | Iyer | 438/787 |
| 6,514,876 B1 * | 2/2003 | Thakur et al. | 438/762 |
| 6,576,570 B1 * | 6/2003 | Iyer | 438/787 |
| 6,784,122 B1 * | 8/2004 | Iyer | 438/787 |
| 6,551,665 B1 * | 11/2004 | Iyer | 427/535 |
| 6,815,374 B1 * | 11/2004 | Iyer | 438/787 |

FOREIGN PATENT DOCUMENTS

JP    08-203890    8/1996

* cited by examiner

*Primary Examiner*—Timothy Meeks
*Assistant Examiner*—Howard Abramowitz
(74) *Attorney, Agent, or Firm*—TraskBritt

(57) ABSTRACT

A method for depositing highly conformal silicate glass layers via chemical vapor deposition through the reaction of TEOS and $O_3$ is provided, comprising placing an in-process semiconductor wafer having multiple surface constituents in a plasma-enhanced chemical vapor deposition chamber.

42 Claims, 3 Drawing Sheets

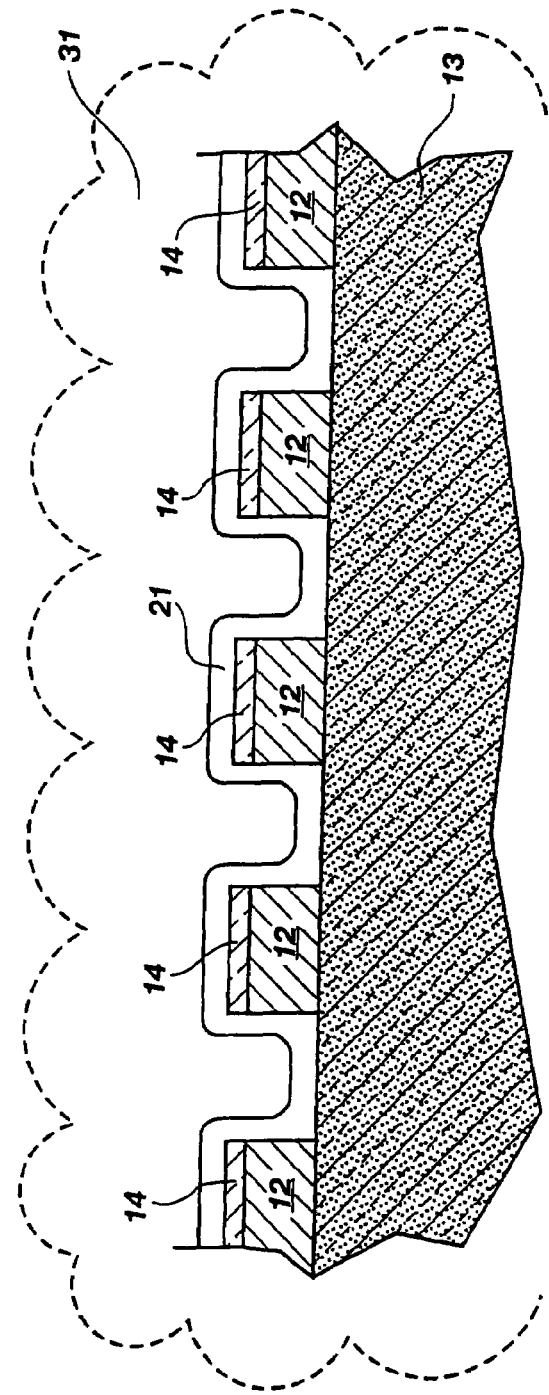
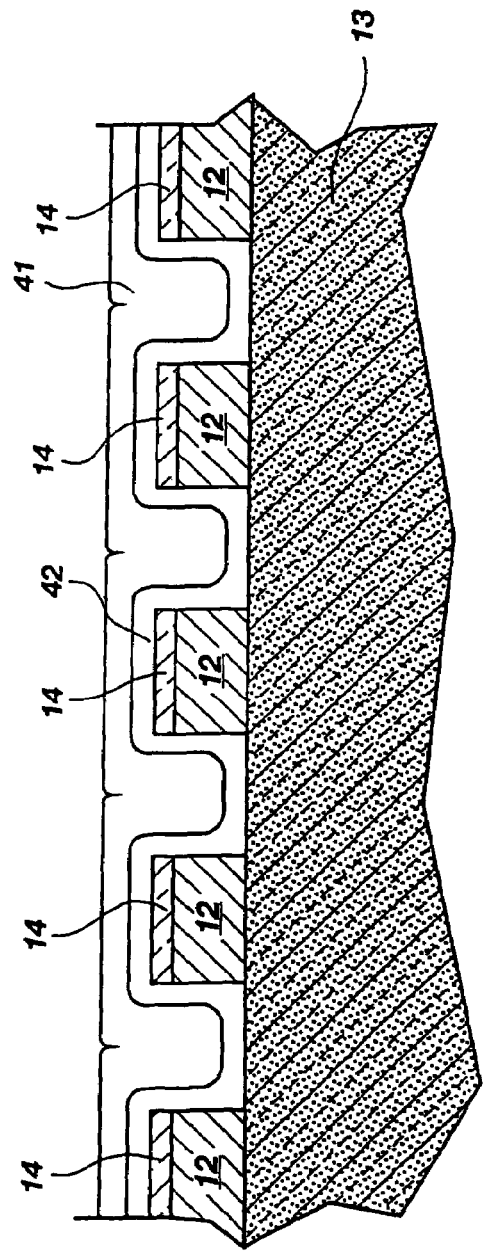
Fig. 3
Fig. 4

METHOD FOR IMPROVING THICKNESS UNIFORMITY OF DEPOSITED OZONE-TEOS SILICATE GLASS LAYERS

CROSS-REFERENCE TO RELATED APPLICATIONS

This application is a continuation of application Ser. No. 10/371,674, filed Feb. 21, 2003, now U.S. Pat. No. 6,784,122, issued Aug. 31, 2004, which is a continuation of application Ser. No. 08/841,908, filed Apr. 17, 1997, now U.S. Pat. No. 6,551,665, issued Apr. 22, 2003.

BACKGROUND OF THE INVENTION

1. Field of the Invention

This invention relates to processes for depositing compounds by means of chemical vapor deposition and, more particularly, to processes for depositing silicon dioxide layers using ozone and tetraethylorthosilane as precursor compounds.

2. State of the Art

Doped and undoped silicon dioxides, which are commonly referred to as silicate glasses, are widely used as dielectrics in integrated circuits. Although silicon dioxide possesses a tetrahedral matrix, which will impart a crystalline structure to the material under proper heating and cooling conditions; the silicon dioxides used as dielectrics in integrated circuits are typically amorphous materials. This application uses the term "silicate glass" to refer to silicon dioxides deposited via chemical vapor deposition (CVD), as the term encompasses materials containing not just silicon dioxide, but dopants and other impurities as well.

Chemical vapor deposition of silicate glasses has become of paramount importance in the manufacture of contemporary integrated circuits. For example, silicate glass doped with both boron and phosphorous is widely used as an interlevel dielectric and as a getter material for mobile sodium ions.

Chemical vapor deposition (CVD) of silicate glasses by the semiconductor industry is most commonly accomplished by reacting tetraethylorthosilane (TEOS), silane or disilane with an oxidizer. Silane is typically reacted with diatomic oxygen ($O_2$) or nitrous oxide ($N_2O$) at a temperature of about 400° C. TEOS, on the other hand, is generally reacted with either $O_2$ or ozone ($O_3$). If a low reaction temperature is desirable, the use of ozone permits a reduction in the reaction temperature to about half that required for $O_2$. For the sake of brevity, glass layers deposited from the reaction of $O_3$ and TEOS shall be termed "ozone-TEOS glasses." The reaction temperature may also be reduced for the TEOS-$O_2$ reaction by striking a plasma in the deposition chamber. Glasses deposited via this plasma-enhanced chemical vapor deposition (PECVD) method shall be referred to hereinafter as PECVD-TEOS silicate glasses. The plasma generates highly reactive oxygen radicals which can react with the TEOS molecules and provide rapid deposition rates at much reduced temperatures.

Silane is used for the deposition of silicate glasses when substrate topography is minimal, as the deposited layers are characterized by poor conformality and poor step coverage. Silicate glasses deposited from the reaction of TEOS with $O_2$ or $O_3$ are being used with increasing frequency as interlevel dielectrics because the deposited layers demonstrate remarkable conformality that permits the filling of gaps as narrow as 0.25 μm. Unfortunately, the deposition rate of silicate glass formed by the reaction of TEOS and $O_3$ is highly surface dependent. A particularly acute problem arises when the deposition is performed on a surface having topographical features with non-uniform surface characteristics. For example, the deposition rate is very slow on PECVD-TEOS glass layers, considerably faster on silicon and on aluminum alloys, and faster still on titanium nitride, which is frequently used as an anti-reflective coating for laser reflow of aluminum alloy layers. A correlation seems to exist between the quality and relative deposition rate of ozone-TEOS glass layers. For example, ozone-TEOS glass layers that are deposited on PECVD-TEOS glass layers have rough, porous surfaces and possess high etch rates.

In U.S. Pat. No. 5,271,972 to K. Kwok et al., it is suggested that the surface sensitivity of ozone-TEOS glass layers deposited on PECVD-TEOS glass layers may be related to the presence of a hydrophilic surface on the PECVD-TEOS glass layers. A hydrophilic surface on the PECVD-TEOS glass layer may be attributable to embedded elemental carbon particles, which are formed as the TEOS precursor gas is attached by oxygen radicals generated by the plasma. As elemental carbon particles are characteristically hydrophilic, they repel TEOS molecules, which are characteristically hydrophobic, and interfere with their absorption on the surface of the deposited layer. Thus, the poor absorption rate of TEOS molecules on the surface of PECVD-TEOS glass results in slowly deposited, poor-quality films. Experimental evidence indicates that deposition rates are low for hydrophilic surfaces and high for hydrophobic surfaces. For example, titanium nitride, being highly hydrophobic, readily absorbs TEOS molecules on its surface, which accelerates the deposition reaction.

Given the surface-dependent variation in deposition rates, it is not uncommon for ozone-TEOS glass layers to build up rapidly around aluminum conductor lines and much more slowly on PECVD glass layers on which the conductor lines are fabricated, thereby forming cavities of tear-drop cross section between adjacent conductor lines. FIG. 1 is a cross-sectional view that depicts the undesirable result obtained by conventionally depositing an ozone-TEOS layer 11 over aluminum conductor lines 12, which overlie an underlying PECVD-TEOS glass layer 113. Prior to patterning, the aluminum conductor lines 12 were covered with a titanium nitride layer, which served as an anti-reflective coating during a laser reflow operation. A titanium nitride layer 14 remnant is present on the upper surface of each aluminum conductor line 12. A cavity 15 having a teardrop-shaped cross section has formed between each pair of aluminum conductor lines 12. Cavities in an interlevel dielectric layer are problematic primarily because they can trap moisture when the deposited glass layer is subjected to a planarizing chemical mechanical polishing step during a subsequent fabrication step. The moisture, if not completely removed prior to the deposition of subsequent layers, can corrode metal conductor lines during normal use and operation of the part, or it may cause an encapsulated integrated circuit device to rupture if the steam generated as the device heats up is unable to escape the package.

In U.S. Pat. No. 5,271,972, a technique is disclosed for improving the film quality of ozone-TEOS glass layers deposited on PECVD-TEOS glass layers. The method involves depositing the underlying PECVD-TEOS layer using high pressure and a high ozone-to-TEOS flow rate. For the last several seconds of the plasma-enhanced deposition process, a stepwise reduction in reactor power is carried out. It is claimed that this technique produces an interstitial silicon dioxide layer at the surface of the PECVD-TEOS layer, which greatly reduces the surface sensitivity of subsequently deposited ozone-TEOS oxide layers.

BRIEF SUMMARY OF THE INVENTION

This invention provides an alternative method for depositing highly conformal silicate glass layers via chemical vapor deposition through the reaction of TEOS and $O_3$ and for minimizing surface effects of different materials on the deposition process.

The entire method, which can be performed in a single cluster tool or even in a single chamber, begins by placing an in-process integrated circuit having multiple surface constituents in a plasma-enhanced chemical vapor deposition chamber. A "clean" silicate glass base layer that is substantially free of carbon particle impurities on an upper surface thereof is then formed on the wafer surface in one of two ways.

The first way of forming the clean base layer employs plasma-enhanced chemical vapor deposition using TEOS and diatomic oxygen gases as precursors to first deposit a "dirty" silicate glass base layer having carbon particle impurities embedded on the upper surface. Glass layers deposited via PECVD by the reaction of TEOS and $O_2$ tend to have elemental carbon particles embedded therein. As these particles may impart hydrophilic surface characteristics to the deposited glass layer, which may interfere with the subsequent deposition of dense, high-quality ozone-TEOS glass layers, the glass base layer is subjected to a plasma treatment, which involves flowing a mixture of an oxygen-containing diamagnetic oxidant, such as ozone or hydrogen peroxide or a combination of both, and diatomic oxygen gas into the chamber and striking an RF plasma at a power of 50–350 watts for a period of from 30–300 seconds. It is hypothesized that the plasma treatment burns off the carbon particle impurities that are present on the surface of the dirty silicate glass base layer, thereby reducing the hydrophilic surface characteristics. The plasma treatment also creates a high degree of surface uniformity on the PECVD-deposited $O_2$-TEOS glass layer.

The second way of forming the base layer involves flowing hydrogen peroxide vapor and at least one gaseous compound selected from the group consisting of silane and disilane into the deposition chamber. As an optional step, the clean base layer formed via this second method may be subjected to a plasma treatment identical to that performed on the dirty PECVD-deposited $O_2$-TEOS glass layer. This optional plasma treatment step is performed merely to improve surface uniformity, not reduce hydrophilic surface characteristics.

Following the formation of the clean base layer, a final glass layer is deposited over the PECVD-deposited glass layer using chemical vapor deposition and TEOS and ozone as precursor compounds.

BRIEF DESCRIPTION OF THE SEVERAL VIEWS OF THE DRAWINGS

FIG. 3 is a cross-sectional view of the in-process circuit portion of FIG. 2 following plasma treatment;

FIG. 4 is a cross-sectional view of the in-process circuit portion of FIG. 3 following the deposition of a final ozone-TEOS glass layer.

DETAILED DESCRIPTION OF THE INVENTION

Figure 1:
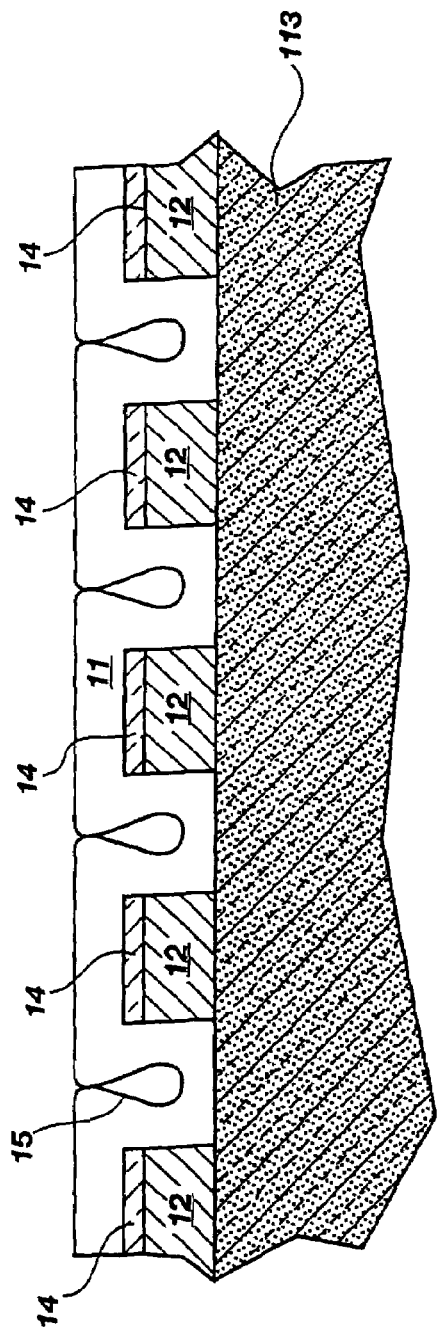
FIG. 1 is a cross-sectional view of a portion of an in-process integrated circuit that has been subjected to a conventional blanket deposition of ozone-TEOS silicate glass.
Figure 2:
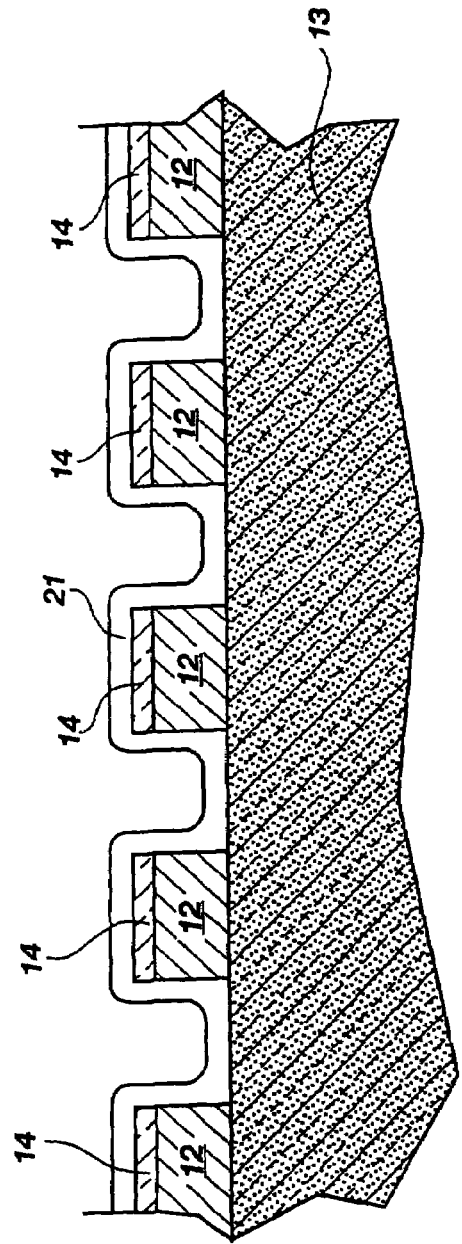
FIG. 2 is a cross-sectional view of a portion of an in-process integrated circuit identical to that of FIG. 1 following deposition of a glass base layer.

This invention is embodied in a process for depositing highly conformal silicate glass layers via chemical vapor deposition through the reaction of tetraethylorthosilane (TEOS) and $O_3$. The entire process, which can be performed in a single cluster tool or even in a single chamber, begins by placing an in-process semiconductor wafer in a plasma-enhanced chemical vapor deposition chamber. In a typical case, hundreds of integrated circuits are undergoing simultaneous fabrication on the wafer, and each integrated circuit has topography with multiple surface constituents. FIG. 2 is a cross-sectional view that depicts a small portion of an integrated circuit identical to that of FIG. 1. A plurality of parallel aluminum conductor lines 12 overlies a silicon dioxide layer 13 (previously referred to as PECVD-TEOS glass layer 113). Each aluminum conductor line 12 is covered with a titanium nitride layer 14, which served as an anti-reflective coating during a laser reflow operation which preceding the masking and etching steps that formed the conductor lines. Each of the different materials has different surface characteristics which affect the rate of deposition for ozone-TEOS glass layers.

In order to eliminate surface characteristics, a "clean" silicate glass base layer is formed which completely covers all existing topography. The base layer must be clean in the sense that its upper surface is free of hydrophilic carbon particle impurities that would interfere with the deposition of an ozone-TEOS final glass layer. The clean base layer may be formed in one of two ways.

Referring now to FIG. 2, the first way involves depositing a "dirty" silicate glass base layer 21 on all constituent surfaces via plasma-enhanced chemical vapor deposition (PECVD). The PECVD deposition of the silicate glass base layer 21 is performed in a deposition chamber in which a plasma is formed from a mixture of TEOS, oxygen and an inert carrier gas such as helium or argon which transports TEOS molecules to the chamber.

Deposition of the PECVD silicate glass base layer 21 is effected within a plasma deposition chamber at a pressure within a range of about 1–50 torr (preferably within a range of about 1–10 torr), an oxygen flow rate of about 100–1000 sccm, a carrier gas flow rate of about 100–1500 sccm, and with an RF power density of about 0.7 watts/cm$^2$ to about 3.0 watt/cm$^2$. The deposition temperature is maintained within a range of about 300 to 500° C., with a preferred temperature of about 375° C. This process is described in greater detail in U.S. Pat. No. 4,872,947, which issued to Wong et al., and is assigned to Applied Materials, Inc. This patent is incorporated herein by reference.

A suitable CVD/PECVD reactor in which the present process can be carried out in its entirety is also described in U.S. Pat. No. 4,872,947. Silicate glass layers can be deposited using standard high frequency RF power or a mixed frequency RF power.

The silicate glass base layer 21 is deposited to an average thickness within a range of about 100 to 1000 Å. The optimum thickness is deemed to be approximately 500 Å. Although the deposition rate of plasma-enhanced chemical-vapor-deposited oxide from TEOS and $O_2$ is more even on different surfaces than it is for ozone-TEOS oxide, it is essential that all surfaces are completely covered.

An untreated TEOS silicate glass layer deposited via a plasma-enhanced CVD process tends to have embedded elemental carbon particles which are formed as the TEOS precursor gas is attacked by oxygen radicals generated by the plasma. These carbon particles apparently impart hydrophilic surface characteristics to an untreated silicate glass base layer 21, which are most likely responsible for the uneven deposition rates observed during subsequent depositions of dense, high-quality PECVD ozone-TEOS glass layers. In order to reduce or eliminate such interfering surface characteristics, the dirty silicate glass base layer 21 is subjected to a plasma treatment which involves flowing a mixture of an oxygen-containing diamagnetic oxidant gas, such as ozone ($O_3$) or hydrogen peroxide ($H_2O_2$) or a combination of both, and diatomic oxygen ($O_2$) gas into the chamber and striking an RF plasma. A mixture of 4 to 15 percent $O_3$ or $H_2O_2$ in $O_2$ is admitted to the chamber at a flow rate of about 2,400 standard cc/min. The plasma is sustained at a power density setting of 0.25 watt/cm$^2$ to about 3.0 watt/cm$^2$ for a period of from 30–360 seconds. In order to prevent etching of the deposited silicate glass base layer 21 and uncovering of additional impurity sites, a remote-source plasma generator is preferred over a parallel-plate reactor. The plasma treatment is represented by FIG. 3, which depicts a plasma cloud 31 which completely engulfs the in-process integrated circuit portion of FIG. 2, thereby exposing all surfaces of the silicate glass base layer 21 to the oxygen plasma. It is hypothesized that the plasma treatment burns off impurities, such as the carbon particles, which are present in the PECVD-deposited silicate glass base layer 21, thereby reducing or eliminating the hydrophilic surface characteristics. The plasma treatment creates a high degree of surface uniformity on the PECVD-deposited silicate glass base layer 21.

Referring once again to FIG. 2, which may also be used to represent the second method of forming a dirty silicate glass base layer 21, a non-plasma-enhanced chemical vapor deposition effected by flowing hydrogen peroxide vapor and at least one gaseous compound selected from the group consisting of silane and disilane into the deposition chamber. A clean silicate glass base layer having no embedded carbon particle impurities is deposited. The reaction of hydrogen peroxide vapor with either silane or disilane is performed within a temperature range of about 0° C. to 40° C., at a chamber pressure of less than about 10 torr, and at a flow rate maintained for silane or disilane within a range of about 10 sccm to 1,000 sccm. The hydrogen peroxide is introduced into the deposition chamber in combination with at least one carrier gas selected from the group consisting of nitrogen and the noble gases. The hydrogen peroxide is picked up by the carrier gas in a bubbler apparatus, and the flow rate of the carrier gas (with the hydrogen peroxide) into the deposition chamber is maintained within a range of about 50 sccm to 1,000 sccm. In addition, the hydrogen peroxide may be introduced into the deposition chamber via liquid injection using a liquid-flow controller in combination with a vaporizer.

As an optional step, the clean base layer formed via this second method may be subjected to a plasma treatment identical to that performed on the dirty PECVD-deposited $O_2$-TEOS glass layer. This optional plasma treatment step is performed merely to improve surface uniformity, not reduce hydrophilic surface characteristics.

Referring now to FIG. 4, an ozone-TEOS silicate glass layer 41 is deposited on top of the clean silicate glass base layer 42. As the processes required for the formation of the silicate glass base layer, the plasma treatment step, and the ozone-TEOS deposition step share certain parameters in common, the same chamber can be used for all process steps. For the plasma treatment step, the TEOS flow and the concomitant carrier gas flow are terminated, plasma generation continues, and ozone is added to the still flowing $O_2$ gas. For the ozone-TEOS deposition step, the TEOS flow is resumed and the $O_2$ and $O_3$ ratios are adjusted as necessary. The ozone-TEOS deposition step is accomplished by flowing TEOS, oxygen and ozone gases into the deposition chamber, which is maintained at a pressure greater than 10 torr, and, preferably, within a range of about 500 to 760 torr. Substrate temperatures are maintained within a range of about 300–600° C., and preferably at a temperature of about 400° C. A dense, highly conformal ozone-TEOS silicate glass layer 41 is deposited that rapidly fills in the remaining gaps between the aluminum conductor lines 12. The ozone-TEOS silicate glass layer 41 demonstrates a high degree of conformality upon deposition. Cavities present in ozone-TEOS silicate glass layers deposited using conventional deposition methods are eliminated.

The present process is highly advantageous because deposition of the PECVD silicate glass base layer 21, plasma treatment of the silicate glass base layer 21, and deposition of the ozone-TEOS silicate glass layer 41 can be performed in sequence, in the same reaction chamber, requiring a minimum of changes in the reactor, and without having to remove the substrate from the reaction chamber between the various steps. Likewise, if the silicate glass base layer is deposited using hydrogen peroxide and silane or disilane as precursors, all steps may be performed within the same reaction chamber without having to remove the substrate from the chamber between the various steps.

Figure 5:
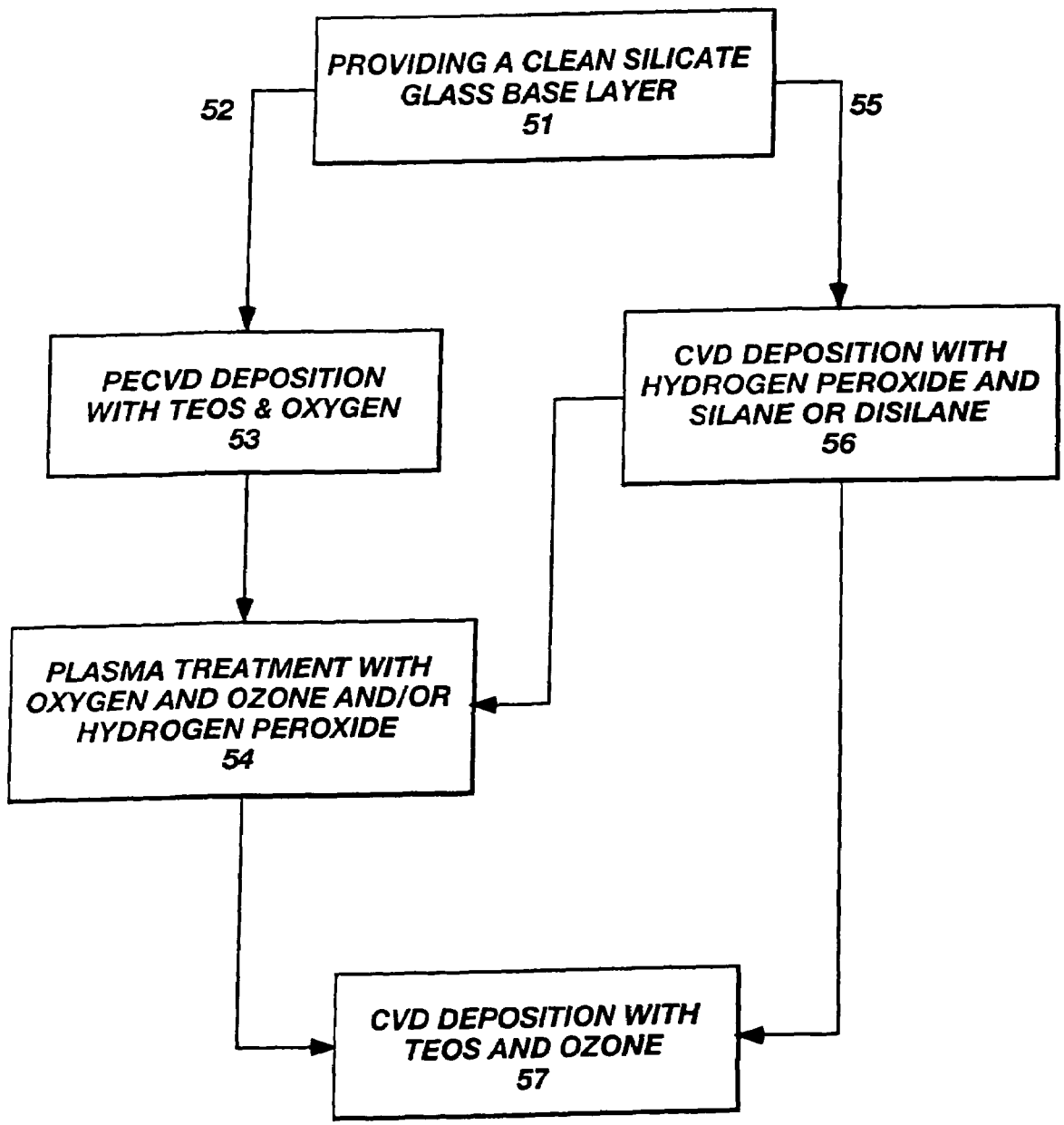
FIG. 5 is a flow chart summarizing the various steps of the invention.

FIG. 5 summarizes the various options of the process which is the subject of this disclosure. The first major step, providing a "clean" silicate glass base layer 51, can be performed in two basic methods: the dirty deposition and cleaning route 52 using TEOS and $O_2$ as precursor gases for a PECVD deposition step 53 followed by a cleaning plasma treatment step 54 involving $O_2$ and $H_2O_2$ and/or $O_3$, or the CVD route 55 using silane or disilane and $H_2O_2$ as precursor gases in a CVD deposition step 56 and, optionally, the plasma surface treatment of cleaning plasma treatment step 54. The final step 57 is CVD deposition of a final glass layer using TEOS and $O_3$ as precursor gases.

Various changes to the gas mixtures, temperature and pressure of the reactions are contemplated and are meant to be included herein. Although the ozone-TEOS glass deposition process is described in terms of only a single embodiment, it will be obvious to those having ordinary skill in the art of semiconductor integrated circuit fabrication that changes and modifications may be made thereto without departing from the scope and the spirit of the invention as hereinafter claimed.

What is claimed is:

1. A deposition method for a semiconductor wafer in a vapor deposition chamber having a plasma generator comprising:

flowing a gaseous mixture comprising TEOS and diatomic oxygen into the vapor deposition chamber while generating a plasma in the vapor deposition chamber for depositing a silicate glass base layer having an upper surface on the semiconductor wafer, the silicate glass base layer having carbon particle impurities on the upper surface thereof;

subjecting the silicate glass base layer to a plasma ignited in a gaseous atmosphere in the vapor deposition chamber containing a mixture of diatomic oxygen and a diamagnetic, oxygen-containing oxidant for a period sufficient to convert the carbon particle impurities to a carbon-containing gas for removal from the vapor deposition chamber; and forming another glass layer on the upper surface by flowing TEOS gas and ozone gas into the vapor deposition chamber.

2. The method of claim 1, wherein the diamagnetic, oxygen-containing oxidant is selected from the group consisting of ozone and hydrogen peroxide.

3. The method of claim 1, wherein a thickness of the silicate glass base layer is within a range of 100–1000 Å.

4. The method of claim 1, wherein the plasma ignited in the gaseous atmosphere containing the diamagnetic, oxygen-containing oxidant is maintained at a power density setting within a range of about 0.7 to 3.0 watts/cm$^2$.

5. The method of claim 1, wherein the silicate glass base layer is subjected to the plasma ignited in the gaseous atmosphere for a period of 30 to 360 seconds.

6. The method of claim 1, wherein a final glass layer is deposited at a temperature within a range of about 300 to 600° C.

7. The method of claim 1, wherein a final glass layer is deposited at pressures within a range of about 10 to 760 torr.

8. A deposition method for depositing a TEOS silicate glass layer on a semiconductor wafer in a deposition chamber, comprising:

flowing a gaseous mixture comprising at least TEOS and diatomic oxygen into the deposition chamber while generating a plasma in the deposition chamber for depositing a silicate glass base layer having an upper surface on the semiconductor wafer, the silicate glass base layer having carbon particle impurities on the upper surface thereof;

subjecting the silicate glass base layer to a plasma ignited in a gaseous atmosphere in the deposition chamber containing a mixture of diatomic oxygen and a diamagnetic, oxygen-containing oxidant for a period sufficient to convert the carbon particle impurities to a carbon-containing gas for removal from the deposition chamber; and forming another glass layer over the silicate glass base layer by effecting a chemical vapor deposition reaction between TEOS gas and ozone gas.

9. The method of claim 8, wherein the diamagnetic, oxygen-containing oxidant is selected from the group consisting of ozone and hydrogen peroxide.

10. The method of claim 8, wherein a thickness of the silicate glass base layer is within a range of 100–1000 Å.

11. The method of claim 8, wherein the plasma ignited in the gaseous atmosphere containing the diamagnetic, oxygen-containing oxidant is maintained at a power density setting within a range of about 0.7 to 3.0 watts/cm$^2$.

12. The method of claim 8, wherein the silicate glass base layer is subjected to the plasma ignited in the gaseous atmosphere for a period of 30 to 360 seconds.

13. The method of claim 8, wherein a final glass layer is deposited at a temperature within a range of about 300 to 600° C.

14. The method of claim 8, wherein a final glass layer is deposited at pressures within a range of about 10 to 760 torr.

15. A method for an in-process semiconductor wafer in a vapor deposition chamber having a plasma generator comprising:

flowing a gaseous mixture comprising TEOS and oxygen into the vapor deposition chamber while generating a plasma in the vapor deposition chamber for depositing a silicate glass base layer having an upper surface on the in-process semiconductor wafer, the silicate glass base layer having carbon particle impurities on the upper surface thereof;

subjecting the silicate glass base layer to a plasma ignited in a gaseous atmosphere in the vapor deposition chamber containing a mixture of oxygen and a diamagnetic, oxygen-containing oxidant for a period sufficient to convert the carbon particle impurities to a carbon-containing gas for removal from the vapor deposition chamber; and forming another glass layer on the upper surface by flowing TEOS gas and ozone gas into the vapor deposition chamber.

16. The method of claim 15, wherein the oxygen comprises diamagnetic, oxygen-containing oxidant and is selected from the group consisting of ozone and hydrogen peroxide.

17. The method of claim 15, wherein a thickness of the silicate glass base layer is within a range of 100–1000 Å.

18. The method of claim 15, wherein the plasma ignited in the gaseous atmosphere containing a diamagnetic, oxygen-containing oxidant is maintained at a power density setting within a range of about 0.7 to 3.0 watts/cm$^2$.

19. The method of claim 15, wherein the silicate glass base layer is subjected to the plasma ignited in the gaseous atmosphere for a period of 30 to 360 seconds.

20. The method of claim 15, wherein the another glass layer is deposited at a temperature within a range of about 300 to 600° C.

21. The method of claim 15, wherein the another glass layer is deposited at pressures within a range of about 10 to 760 torr.

22. A method for depositing a TEOS silicate glass layer on an in-process semiconductor wafer in a deposition chamber, comprising:

flowing a gaseous mixture comprising at least TEOS and oxygen while generating a plasma in the deposition chamber for depositing a silicate glass base layer having an upper surface on the in-process semiconductor wafer, the silicate glass base layer having carbon particle impurities on the upper surface thereof;

subjecting the silicate glass base layer to a plasma ignited in a gaseous atmosphere in the deposition chamber containing a mixture of oxygen and a diamagnetic, oxygen-containing oxidant for a period sufficient to convert the carbon particle impurities to a carbon-containing gas for removal from the deposition chamber; and forming another glass layer over the silicate glass base layer by effecting a chemical vapor deposition reaction between TEOS gas and ozone gas.

23. The method of claim 22, wherein the diamagnetic, oxygen-containing oxidant is selected from the group consisting of ozone and hydrogen peroxide.

24. The method of claim 22, wherein a thickness of the silicate glass base layer comprises a layer within a range of about 100–1000 Å.

25. The method of claim 22, wherein the plasma ignited in the gaseous atmosphere containing the diamagnetic, oxygen-containing oxidant is maintained at a power density setting within a range of about 0.7 to 3.0 watts/cm$^2$.

26. The method of claim 22, wherein the silicate glass base layer is subjected to the plasma ignited in the gaseous atmosphere for a period of 30 to 360 seconds.

27. The method of claim 22, wherein the another glass layer is deposited at a temperature within a range of about 300 to 600° C.

28. The method of claim 22, wherein the another glass layer is deposited at pressures within a range of about 10 to 760 torr.

29. A method for an in-process semiconductor wafer in a vapor deposition chamber having a plasma generator comprising:

flowing a gaseous mixture comprising TEOS and oxygen into the vapor deposition chamber during generating a plasma in the vapor deposition chamber for depositing a silicate glass base layer having an upper surface on the in-process semiconductor wafer, the silicate glass base layer having carbon particle impurities on the upper surface thereof;

subjecting the silicate glass base layer to a plasma ignited in a gaseous atmosphere in the vapor deposition chamber containing a mixture of oxygen and a diamagnetic, oxygen-containing oxidant for a period sufficient to convert the carbon particle impurities to a carbon-containing gas for removal from the vapor deposition chamber; and forming another glass layer on the upper surface during flowing TEOS gas and ozone gas into the vapor deposition chamber.

30. The method of claim 29, wherein the diamagnetic, oxygen-containing oxidant is selected from the group consisting of ozone and hydrogen peroxide.

31. The method of claim 29, wherein a thickness of the silicate glass base layer is within a range of about 100–1000 Å.

32. The method of claim 29, wherein the plasma ignited in the gaseous atmosphere containing the diamagnetic, oxygen-containing oxidant is maintained at a power density setting within a range of about 0.7 to 3.0 watts/cm$^2$.

33. The method of claim 29, wherein the silicate glass base layer is subjected to the plasma ignited in the gaseous atmosphere for a period of 30 to 360 seconds.

34. The method of claim 29, wherein the another glass layer is deposited at a temperature within a range of about 300 to 600° C.

35. The method of claim 29, wherein the another glass layer is deposited at pressures within a range of about 10 to 760 torr.

36. A method for depositing a TEOS silicate, glass layer on an in-process semiconductor wafer in a deposition chamber, comprising:

flowing a gaseous mixture comprising at least TEOS and oxygen into the deposition, chamber while generating a plasma in the deposition chamber for depositing a silicate glass base layer having an upper surface on the in-process semiconductor wafer, the silicate glass base layer having carbon particle impurities on the upper surface thereof;

subjecting the silicate glass base layer to a plasma ignited in a gaseous atmosphere in the deposition chamber containing a mixture of oxygen and a diamagnetic, oxygen-containing oxidant for a period sufficient to convert the carbon particle impurities to a carbon-containing gas for removal from the deposition chamber; and forming another glass layer over the silicate glass base layer during a chemical vapor deposition reaction between TEOS gas and ozone gas.

37. The method of claim 36, wherein the diamagnetic, oxygen-containing oxidant is selected from the group consisting of ozone and hydrogen peroxide.

38. The method of claim 36, wherein a thickness of the silicate glass base layer is within a range of about 100–1000 Å.

39. The method of claim 36, wherein the plasma ignited in the gaseous atmosphere containing the diamagnetic, oxygen-containing oxidant is maintained at a power density setting within a range of about 0.7 to 3.0 watts/cm$^2$.

40. The method of claim 36, wherein the silicate glass base layer is subjected to the plasma ignited in the gaseous atmosphere for a period of 30 to 360 seconds.

41. The method of claim 36, wherein the another glass layer is deposited at a temperature within a range of about 300 to 600° C.

42. The method of claim 36, wherein the another glass layer is deposited at pressures within a range of about 10 to 760 torr.

* * * * *